(12) United States Patent
Butler

(10) Patent No.: US 7,889,582 B1
(45) Date of Patent: Feb. 15, 2011

(54) SEGMENTED WRITE BITLINE SYSTEM AND METHOD

(75) Inventor: Steven Butler, San Jose, CA (US)

(73) Assignee: NetLogic Microsystems, Inc., Santa Clara, CA (US)

( * ) Notice: Subject to any disclaimer, the term of this patent is extended or adjusted under 35 U.S.C. 154(b) by 341 days.

(21) Appl. No.: 12/046,675

(22) Filed: Mar. 12, 2008

(51) Int. Cl.
*G11C 7/00* (2006.01)

(52) U.S. Cl. ............... 365/195; 365/200; 365/196; 365/154

(58) Field of Classification Search ........... 365/154, 365/156, 195, 196, 200, 206
See application file for complete search history.

(56) References Cited

U.S. PATENT DOCUMENTS

| | | |
|---|---|---|
| 5,245,570 A | 9/1993 | Fazio et al. |
| 5,367,488 A | 11/1994 | An |
| 5,620,915 A | 4/1997 | Chen et al. |
| 5,621,690 A | 4/1997 | Jungroth et al. |
| 5,717,636 A | 2/1998 | Dallabora et al. |
| 5,748,528 A | 5/1998 | Campardo et al. |
| 5,949,696 A | 9/1999 | Threewitt |
| 6,292,407 B1 * | 9/2001 | Porter et al. ........... 365/189.11 |
| 6,310,809 B1 | 10/2001 | Roohparvar et al. |
| 6,650,582 B2 * | 11/2003 | Matsumoto et al. ......... 365/201 |
| 7,800,936 B2 * | 9/2010 | Dillon et al. ................ 365/154 |
| 2002/0136060 A1 | 9/2002 | Taniguchi |
| 2005/0002225 A1 * | 1/2005 | Kanehara et al. ............ 365/154 |

OTHER PUBLICATIONS

Tezzaron Semiconductor, "Soft Errors in Electronic Memory—A White Paper," Jan. 5, 2004, Tezzaron Semiconductor, Version 1.1, pp. 2 & 5.*

* cited by examiner

*Primary Examiner*—Tuan T Nguyen
*Assistant Examiner*—R Lance Reidlinger
(74) *Attorney, Agent, or Firm*—Vista IP Law Group LLP

(57) ABSTRACT

A memory device is provided for performing writing operations on memory cells while maintaining a stability thereof. A memory array is provided including a plurality of memory cells. Additionally, segmented write bitlines are provided for performing writing operations on the memory cells while maintaining a stability thereof.

21 Claims, 5 Drawing Sheets

SEGMENTED WRITE BITLINE SYSTEM AND METHOD

FIELD OF THE INVENTION

The present invention relates to random access memory and more particularly to writing such memory.

BACKGROUND

Conventional random access memory (RAM) operates by sending a charge through an appropriate column to activate a transistor at each bit in the column. A group of cells in the column is called a word. A single cell in the column is typically referred to as a bit.

In many modern computing architectures, the memory supports what is commonly termed a "wide word," sometimes 16, 32, 64, or even 128-bits wide. Also, in modern computing architectures, logical operations on words often include writing only a portion of the wide word. To accomplish this, a write mask mechanism is typically employed to mask writes, thus writing only unmasked bits to the memory wide word without affecting bits at masked positions.

In use, values in the memory cells corresponding to the masked bits must remain stable, and not significantly lose charge or logic value. Measurement of this characteristic is known as cell stability. It is well known that higher current (and hence power) being applied to the write bitlines does indeed enhance such cell stability, however at the cost of power consumption.

As semiconductor feature sizes decrease, attempts to address the attendant cell stability challenges have included using differential bitlines, and also have included performing write masking on those bitlines, either by forcing a '11' on the differential pair, or by floating the shared bitlines. Both of those techniques have cell stability and power consumption characteristics that leave room for improvement.

There is thus a need for addressing these and/or other issues associated with the prior art.

SUMMARY

A memory device is provided for performing writing operations on memory cells while maintaining a stability thereof. A memory array is provided including a plurality of memory cells. Additionally, segmented write bitlines are provided for performing writing operations on the memory cells while maintaining a stability thereof.

DETAILED DESCRIPTION

Figure 1:
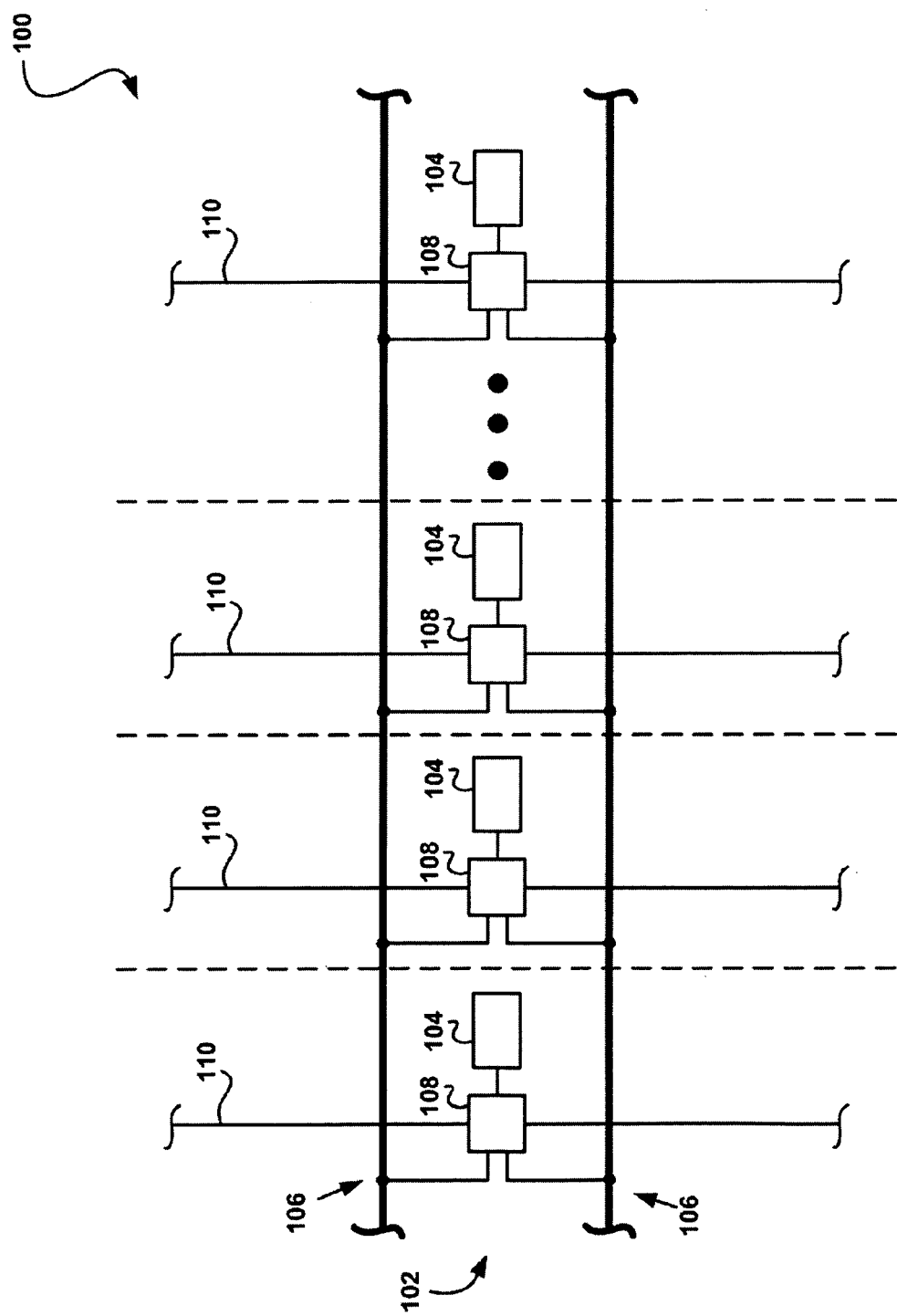
FIG. 1 shows a memory device for performing writing operations on memory cells while maintaining a stability thereof, in accordance with one embodiment.

FIG. 1 shows a memory device 100 for performing writing operations on memory cells while maintaining a stability thereof, in accordance with one embodiment. As shown, a memory array 102 is provided including a plurality of memory cells 104. Additionally, segmented write bitlines 106 are provided for performing writing operations on the memory cells 104 while maintaining a stability thereof.

In the context of the present description, segmented write bitlines refer to any bitlines with a lower capacitance than a global bitline. In this case, a bitline refers to any line used to communicate a signal or data to or in a memory array or cell. Additionally, writing operations refer to any operation capable of writing data to a memory cell. Furthermore, maintaining the stability of a memory cell refers to maintaining a distinguishable logic value in the memory cell (i.e. a "0" or "1").

In addition, the memory array 102 and the memory cells 104 may include various types of memory. For example, in one embodiment, the memory array may include random access memory (RAM) such as static random access memory (SRAM), dynamic random access memory (DRAM), synchronous DRAM (SDRAM), double data rate (DDR) SDRAM, etc. It should be noted that, the memory array 102 may include any number of memory cells 104.

As shown further, the segmented write bitlines 106 may each include a circuit 108 configured for maintaining the stability of the memory device 100. Additionally, the circuit 108 may be electrically connected to a separate select line 110 for enabling functionality of the circuit 108 and allowing potential write operations to be performed to the memory cells 104. It should be noted that the circuit 108 may be configured in any suitable manner for providing stability of the memory device 100. As an option, the circuit 108 may include a plurality of transistors, inverters, and/or multiplexers configured for maintaining the stability.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
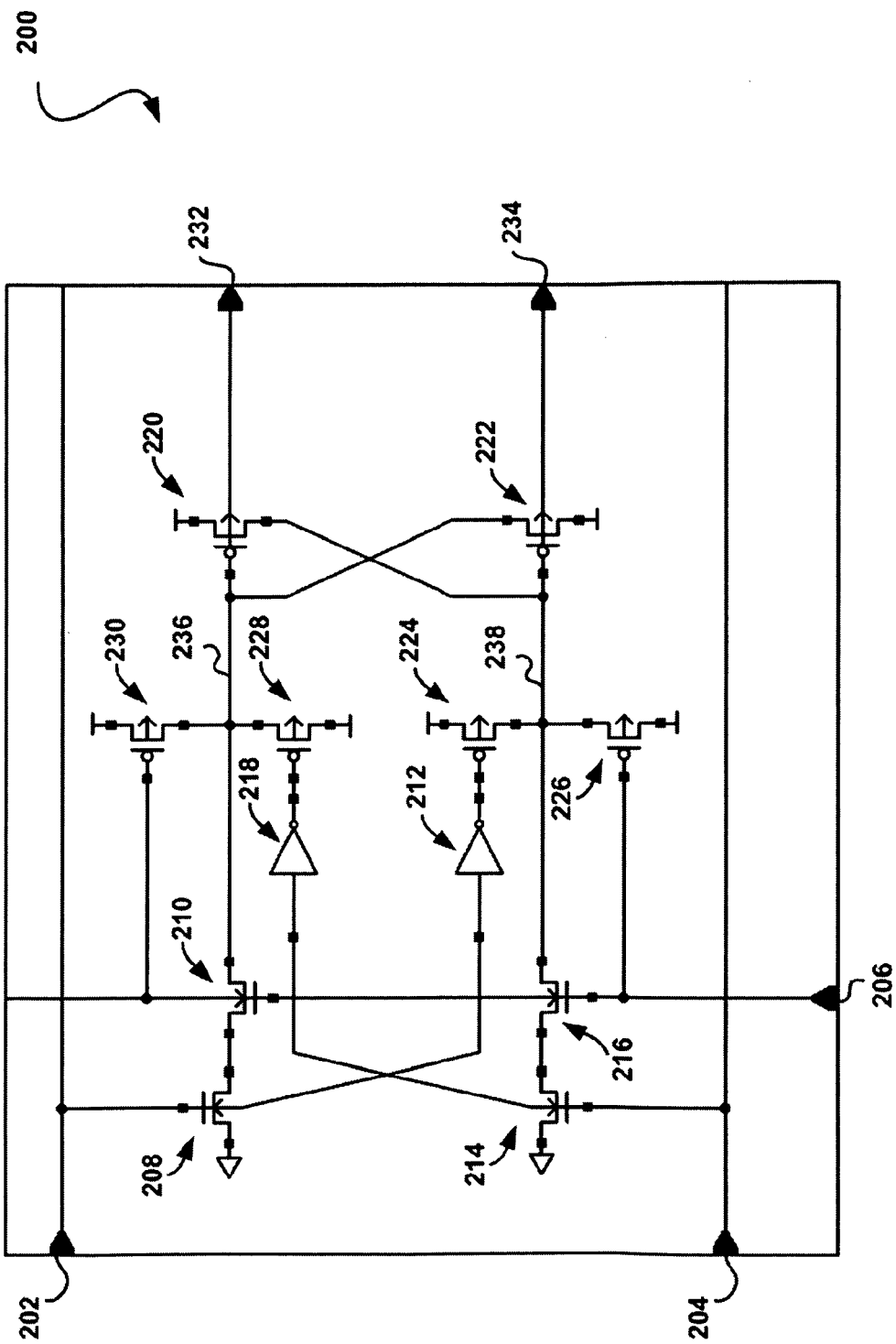
FIG. 2 shows a circuit for maintaining stability of a memory device, in accordance with one embodiment.

FIG. 2 shows a circuit 200 for maintaining stability of a memory device, in accordance with one embodiment. As an option, the present circuit 200 may be viewed in the context of the details of FIG. 1. For example, the functionality of the circuit 200 may be implemented in the context of the description of the circuit 100 from FIG. 1. Of course, however, the circuit 200 may be implemented in any desired environment. It should also be noted that the aforementioned definitions may apply during the present description.

As shown, a first global bitline 202, a second global bitline 204, and a select line 206 are provided. As shown further, a first transistor 208 is electrically connected to the first global bitline 202, a second transistor 210, and a first inverter 212. A third transistor 214 is electrically connected to the second global bitline 204, a fourth transistor 216, and a second inverter 218.

Additionally, the second transistor 210 is electrically connected to the select line 206, the fourth transistor 216, and a fifth transistor 220. The fourth transistor 216 is electrically connected to the select line 206, the second transistor 210, and a sixth transistor 222. Further, the first inverter 212 is electrically connected to a seventh transistor 224, which is electrically connected to an eighth transistor 226. The eighth transistor 226 is also electrically connected to the select line 206.

The second inverter 218 is electrically connected to a ninth transistor 228, which is electrically connected to a tenth transistor 230. The tenth transistor 230 is also electrically connected to the select line 206. Additionally, the fifth transistor 220 is electrically connected to the sixth transistor 222. Furthermore, outputs 232 and 234 of the fifth and sixth transistor 220 and 222 serve as an input to at least one memory cell (not shown).

In operation, the select line 206 may enable or disable components in the circuit 200 such that the memory cells may optionally be utilized. For example, a high signal (i.e. a signal with a logic value "1") on the select line 206 will allow data to be written to the memory cells. On the other hand, a low signal (i.e. a signal with a logic value "0") will prevent data to be written to the memory cells. In this way, the select line 206 may serve as a memory bank select line, enabling access to certain memory banks and cells.

When the select line 206 has a high signal, the first and the second global bitlines 202 and 204 may then be utilized to determine whether data will be written to the memory cells. For example, when both the first and the second global bitlines 202 and 204 have a signal of "0 0," the first and third transistor 208 and 214 do not switch on. Additionally, the signal flows through the first and second inverters 212 and 218 to the seventh transistor 224 and the ninth transistor 228, which also remain off. As a result, data on the first and the second global bitlines 202 and 204 may be relayed freely to the memory cells.

In this way, a no-operation case (i.e. "0 0") on the first and the second global bitlines 202 and 204 allows a first and second local bitlines 236 and 238 to float. Further, because of the low capacitance in the first and the second global bitlines 202 and 204 due to the segmented implementation, the transfer of the data to the memory cells remains stable. Additionally, power is conserved due to the segmented implementation, compared to a standard un-segmented bitline. Moreover, the circuit 200 may be utilized to implement data masking operations. In the context of the present description, a mask operation refers to any operation where only selected bits (e.g. unmasked bits, etc.) are written to memory.

For example, in the case that the first bitline 202 has a signal of "1" and the second bitline 204 has a signal of "0," the first transistor 208 will switch on, in addition to the seventh transistor 224, while the third transistor 214 and the ninth transistor 228 remain off. As a result, the first local bitline 236 will be driven to a low logic value (i.e. "0"), and the second local bitline 238 will be driven to a high logic value (i.e. "1"), allowing data to be output to a memory cell through output 234.

Similarly, when the first bitline 202 has a signal of "0" and the second bitline 204 has a signal of "1," the first local bitline 236 will be driven to a high logic value, while the second local bitline 238 is low, allowing data to be output to a memory cell through output 232. In this way, a mask operation may be performed in conjunction with writing operations, based on global bitline commands.

Figure 3:
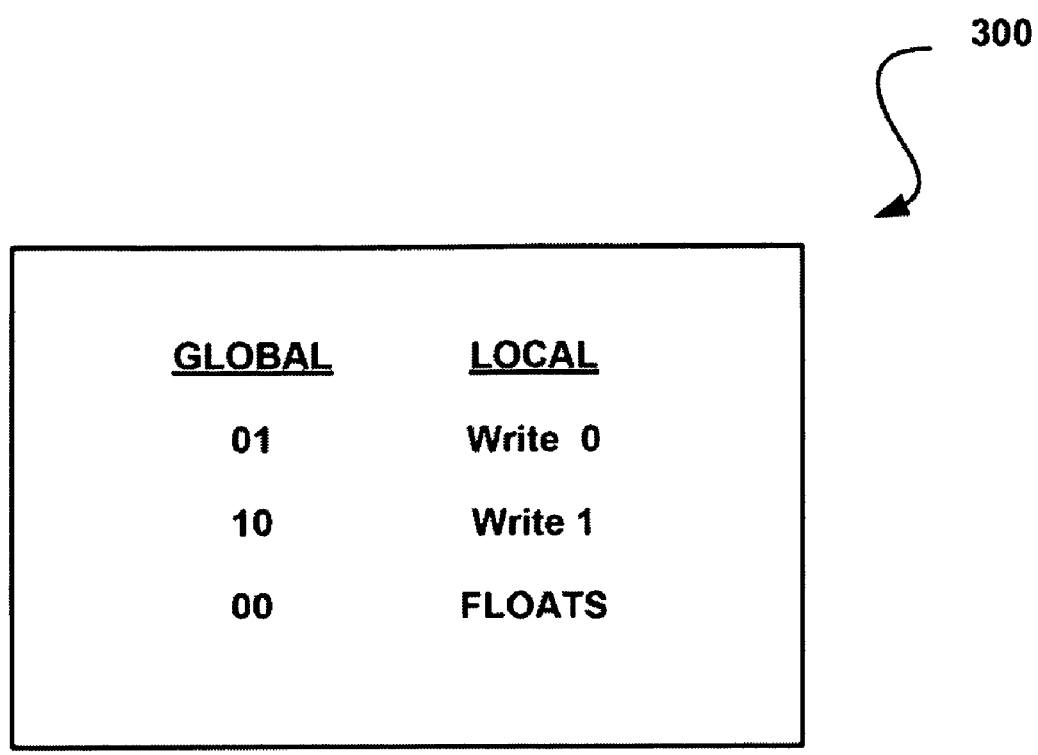
FIG. 3 shows a table illustrating global bitline commands compared to associated local bitline commands, in accordance with one embodiment.

FIG. 3 shows a table 300 illustrating global bitline commands compared to associated local bitline commands, in accordance with one embodiment. As noted above, local bitline commands may be determined by the circuit 200 based on global bitline commands. In this case, the segmented write bitlines may support at least three input states.

For example, when a global bitline sends a signal of "0 1," a local bitline is driven to write a "0" to a memory cell. If the global bitline sends a signal of "1 0," the local bitline is driven to write a "1" to the memory cell. Further, if the global bitline sends a signal of "0 0," the circuit 200 floats to a local bitline (e.g. the first and/or second local bitline 236 or 238), as noted above.

With further reference to FIG. 2, it should be noted that, the invertors 212 and 218, and the transistors 224 and 228 are utilized for low voltage functionality. In another embodiment, the invertors 212 and 218, and the transistors 224 and 228 may be omitted from the circuit 200 while still maintaining segmented bitline and masking functionality. Furthermore, it should be noted that the transistors 220 and 222 are utilized for noise reduction. As such, the transistors 220 and 222 may also be omitted in certain embodiments.

Figure 4:
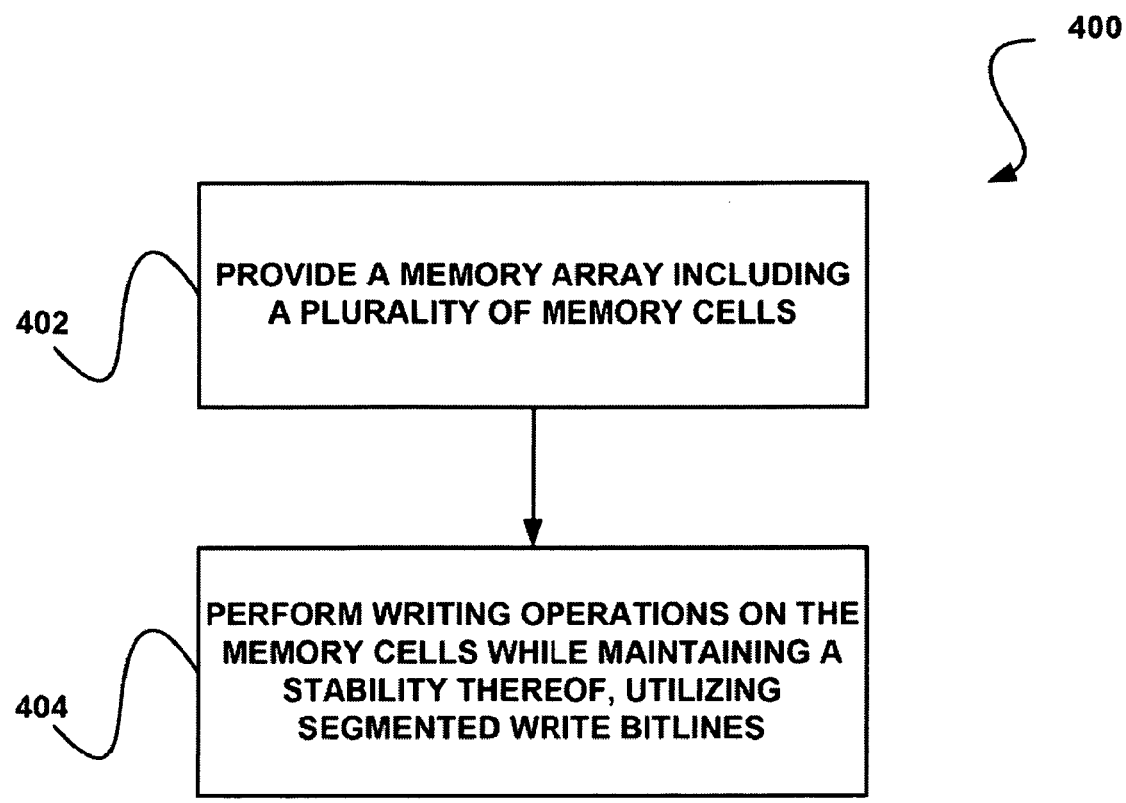
FIG. 4 shows a method for performing writing operations on memory cells while maintaining a stability thereof, utilizing segmented write bitlines, in accordance with one embodiment.

FIG. 4 shows a method 400 for performing writing operations on memory cells while maintaining a stability thereof, utilizing segmented write bitlines, in accordance with one embodiment. As an option, the present method 400 may be implemented in the context of the functionality and architecture of FIGS. 1-3. Of course, however, the method 400 may be carried out in any desired environment. Further, the aforementioned definitions may apply during the present description.

As shown, a memory array is provided including a plurality of memory cells. See operation 402. Additionally, writing operations are performed on the memory cells while maintaining a stability thereof, utilizing segmented write bitlines. See operation 404. As an option, a mask operation may also be performed in conjunction with the writing operations.

Figure 5:
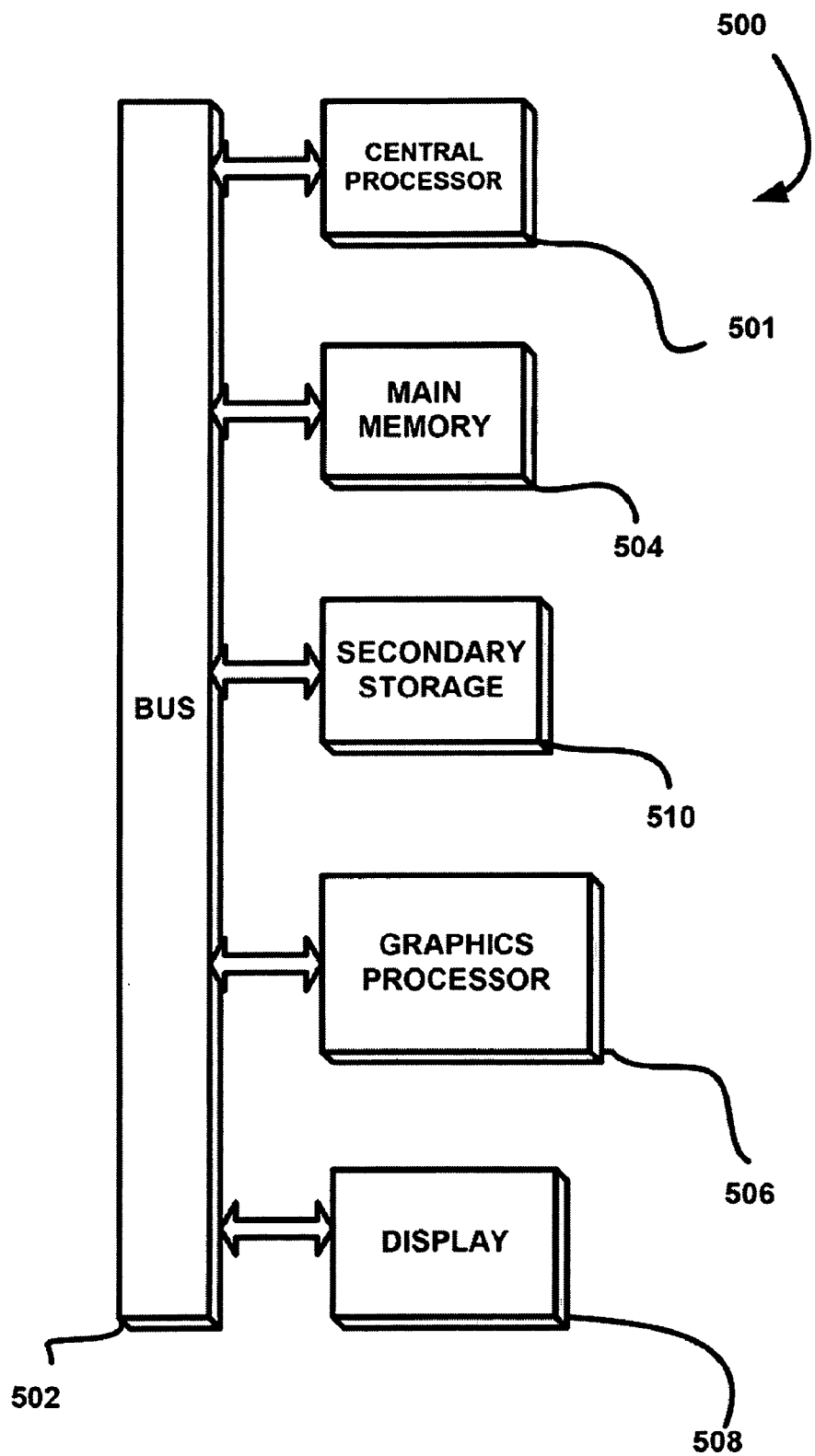
FIG. 5 illustrates an exemplary system in which the various architecture and/or functionality of the various previous embodiments may be implemented.

FIG. 5 illustrates an exemplary system 500 in which the various architecture and/or functionality of the various previous embodiments may be implemented. As shown, a system 500 is provided including at least one host processor 501 which is connected to a communication bus 502. The system 500 also includes a main memory 504. Control logic (software) and data are stored in the main memory 504 which may take the form of random access memory (RAM).

The system 500 may optionally include a graphics processor 506 and a display 508, i.e. a computer monitor. The system 500 may also include a secondary storage 510. The secondary storage 510 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 504 and/or the secondary storage 510. Such computer programs, when executed, enable the system 500 to perform various functions. Memory 504, storage 510 and/or any other storage are possible examples of computer-readable media.

In one embodiment, the architecture and/or functionality of the various previous figures may be implemented in the context of the host processor 501, graphics processor 506, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, an application-specific system, and/or any other desired system. For example, the system 500 may take the form of a desktop computer, lap-top computer, and/or any other type of logic. Still yet, the system 500 may take the form of various other devices including, but not limited to a personal digital assistant (PDA) device, a mobile phone device, a television, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A memory device, comprising:
    a memory array including a plurality of memory cells coupled to a circuit;
    a global bitline for providing a global bitline command to the circuit; and
    a local bitline for providing a local bitline command from the circuit for performing writing operations on the memory cells while maintaining distinguishable logic value of a masked bit in the memory cells, wherein the circuit performs a mask operation in conjunction with the writing operations based at least in part on the global bitline command, wherein the mask operation comprises an operation where one or more selected bits are written to the memory cells while other bits of the memory cells are not affected.

2. The memory device of claim 1, wherein the memory array includes static random access memory (SRAM).

3. The memory device of claim 1, wherein the local bitline has a lower capacitance than the global bitline.

4. The memory device of claim 1, wherein the local bitline supports at least three input states.

5. The memory device of claim 1, wherein the circuit is configured for maintaining the stability of the memory cells.

6. The memory device of claim 5, wherein the circuit includes a plurality of transistors configured for maintaining the stability.

7. The memory device of claim 5, wherein the circuit includes a plurality of inverters configured for maintaining the stability.

8. A method, comprising:
    providing a memory array including a plurality of memory cells coupled to a circuit;
    utilizing a global bitline to provide a global bitline command to the circuit; and performing writing operations on the memory cells while maintaining a distinguishable logic value of a masked bit in the memory cells by utilizing a local bitline to provide a local bitline command from the circuit, wherein the circuit performs a mask operation in conjunction with the writing operations based at least in part upon the global bitline command, wherein the mask operation comprises an operation where one or more selected bits are written to the memory cells while other bits of the memory cells are not affected.

9. The method of claim 8, wherein the memory array includes static random access memory (SRAM).

10. The method of claim 8, wherein the local bitline has a lower capacitance than the global bitline.

11. The method of claim 8, wherein the local bitline supports at least three input states.

12. The method of claim 8, wherein the circuit is configured for maintaining the stability of the memory cells.

13. The method of claim 12, wherein the circuit includes a plurality of transistors configured for maintaining the stability.

14. The method of claim 12, wherein the circuit includes a plurality of inverters configured for maintaining the stability.

15. A system, comprising:
    a bus;
    a processor in communication with the bus;
    memory in communication with the bus, the memory including a memory array including a plurality of memory cells coupled to a circuit;
    a global bitline for providing a global bitline command to the circuit, and a local bitline for providing a local bitline command from the circuit for performing writing operations on the memory cells while maintaining a distinguishable logic value of a masked bit in the memory cells, wherein the circuit performs a mask operation in conjunction with the writing operations based at least in part upon the global bitline command, wherein the mask operation comprises an operation where one or more selected bits are written to the memory cells while other bits of the memory cells are not affected.

16. The system of claim 15, wherein the memory array includes static random access memory (SRAM).

17. The system of claim 15, wherein the local bitline has a lower capacitance than the global bitline.

18. The system of claim 15, wherein the local bitline supports at least three input states.

19. The system of claim 15, wherein the circuit is configured for maintaining the stability of the memory cells.

20. The system of claim 19, wherein the circuit includes a plurality of transistors configured for maintaining the stability.

21. The memory device of claim 19, wherein the circuit includes a plurality of inverters configured for maintaining the stability.

* * * * *